United States Patent [19]

Hiruma et al.

[11] Patent Number: 4,861,698
[45] Date of Patent: Aug. 29, 1989

[54] PHOTOSENSITIVE LITHOGRAPHIC PLATE USING NO DAMPENING WATER

[75] Inventors: Toshihiko Hiruma; Hiroshi Takahashi; Norihiko Kato, all of Shizuoka, Japan

[73] Assignee: Fuji Photo Film Co., Ltd., Minami-Ashigara, Japan

[21] Appl. No.: 123,787

[22] Filed: Nov. 23, 1987

[30] Foreign Application Priority Data

Nov. 26, 1986 [JP] Japan ................... 61-281194

[51] Int. Cl.$^4$ ............... G03C 1/94; G03C 1/70; G03C 1/71
[52] U.S. Cl. ................... 430/272; 430/159; 430/539; 430/303; 430/531; 430/954; 430/961; 430/286; 430/287; 101/467; 101/457
[58] Field of Search ............ 430/159, 272, 539, 303, 430/531, 954, 961, 286, 287; 101/467, 457

[56] References Cited
U.S. PATENT DOCUMENTS

| | | | |
|---|---|---|---|
| 2,729,562 | 1/1956 | Zemp | 430/160 X |
| 2,937,085 | 5/1960 | Seven et al. | 430/159 |
| 3,677,178 | 7/1972 | Gipe | 430/272 X |
| 4,450,215 | 5/1984 | Reithel et al. | 430/293 X |
| 4,590,148 | 5/1986 | Takahashi et al. | 430/272 X |

FOREIGN PATENT DOCUMENTS

| | | |
|---|---|---|
| 0076565 | 4/1983 | European Pat. Off. |
| 3638419 | 5/1987 | Fed. Rep. of Germany ...... 430/272 |
| 1501128 | 2/1978 | United Kingdom |

Primary Examiner—Paul R. Michl
Assistant Examiner—Cynthia Hamilton
Attorney, Agent, or Firm—Burns, Doane, Swecker & Mathis

[57] ABSTRACT

A photosensitive lithographic plate is suitable for use in making a water-less lithographic plate which does not require dampening water. The photosensitive lithographic plate has a primer layer containing a hardened gelatin, a photosensitive layer and a silicone rubber layer. The silicone rubber layer and the photosensitive layer are imagewise removed as a result of the imagewise exposure and development so as to expose portions of the primer layer corresponding to an image. The exposed gelatin-containing plate is securely adhered to the substrate and is easily dyeable for examination of the formed image.

15 Claims, 1 Drawing Sheet

PHOTOSENSITIVE LITHOGRAPHIC PLATE USING NO DAMPENING WATER

BACKGROUND OF THE INVENTION

1. Field of the Invention

The present invention relates to a lithographic plate which does not require dampening water at press operation (referred to as "water-less plate" hereinafter) and, more particularly, to a photosensitive lithographic plate which does not require dampening water (referred to as "water-less PS plate", hereinafter), which is suitable for use in making the water-less lithographic plate and which is superior in sensitivity, developability, runlength (i.e. press life) and ink-receptive property, as well as in plate-examination property.

2. Description of the Prior Art

Water-less PS plates have been known in which a photosensitive layer and a silicone rubber layer are formed in sequence on a substrate. Such water-less PS plates are disclosed, for example, in U.S. Pat. Nos. 3,511,178; 3,677,178 and 3,894,873; and British Patent No. 1,419,643, as well as in U.S. Pat. No. 4,342,820.

Broadly, there are two types of method of preparing a lithographic plate from a water-less PS plate. In one method, the portion of the photosensitive layer corresponding to an ink-receptive area (referred to as "image area" hereinafter) is dissolved by a developing solution thereby to remove the portion of the silicone rubber layer on the dissolved portion of the photosensitive layer, thereby to form the image area, as disclosed in U.S. Pat. No. 3,511,178. The other method makes use of the photo-bondability and photo-releasability of the photosensitive layer in such a way as to selectively remove the portions of the silicone rubber layer corresponding to the image area, as disclosed in U.S. Pat. Nos. 3,894,873 and 4,342,820.

The first-mentioned method is advantageous in that the developability is not affected substantially even when the strength of bonding between the silicone rubber layer and the photosensitive layer is strong enough, because the image area is formed by removing the photosensitive layer. This means that, according to this type of method, it is possible to obtain a plate having improved anti-scratch and anti-wear characteristics without substantially impairing the developability. On the other hand, this type of method requires that the photosensitive layer be made as thin as possible. Namely, since the image area is formed by a recess penetrating both the photosensitive layer and the silicone layer, the depth of the recess, i.e., the depth of the image area, will become large when the photosensitive layer has a large thickness. Such a large depth of the image area will require a large amount of ink to be supplied to the plate surface, in order to fill such an image area of the large depth.

Under these circumstances, the present inventors have developed a water-less PS plate having a primer layer, a photosensitive layer and a silicone rubber llayer which are formed in the mentioned order on the substrate. In this improved water-less PS plate, the photosensitive layer has a reduced thickness so that it can operate with smaller amount of ink than the conventional water-less PS plate. In addition, this improved water-less PS plate exhibits superior anti-scratch and anti-wear characteristics. The present applicant has already filed an application for a patent on this improved water-less PS plate, as J. P. KOKAI 60-229031.

In this water-less PS plate, a primer layer, a photosensitive layer and a silicone rubber layer are formed in the mentioned order on a substrate, and the primer layer consists of a photo-hardened photo-crosslinkable resin.

In the production of this water-less PS plate, the photosensitive layer and the silicone rubber layer are successively formed on the primer layer by means of suitable organic solvents. On the other hand, in the plate making process, the image area is formed by selectively removing imaging portions of the photosensitive layer and the silicone rubber layer by developing solution which contains an organic solvent. It is essential that the primer layer not be dissolved nor exfoliated due to swell. Thus, the primer layer is required to have strong resistance against solvents.

The portions of the primer layer corresponding to the image area are exposed upon the development. The exposed portions of the primer layer are dyed during or after the development so as to facilitate the examination of the plate whether the image area being precisely reproduced after the development. Therefore, it is also necessary that the primer layer can easily be dyed. Namely, the primer layer is required to have an excellent dyeability.

Thus, the primer layer has to meet both the demands for high anti-solvent characteristic and high dyeability. It is, however, extremely difficult to satisfy both these demands simultaneously. For instance, when an ordinary threedimensionally-crosslinked binder such as a cured epoxy resin is used, the primer layer has to have a high degree of crosslinkage in order to have a high resistance to solvent. While such a high degree of crosslinkage substantially prevents swelling of the primer layer, thereby the dyeability is seriously impaired. If the degree of crosslinkage is lowered for allowing the primer layer to swell substantially, i.e., for attaining a high dyeability, the primer layer can have only a low resistance to solvent. It would be possible to make the primer layer contain a functional group which is easily dyeable. Such a measure, however, is still unsatisfactory. Namely, the primer can be dyed only at its surface region and the dyed image can have only a small density which is not suitable for the plate examination.

SUMMARY OF THE INVENTION

Accordingly, an object of the present invention is to provide a water-less PS plate having a primer layer, a photosensitive layer and a silicone rubber layer formed in sequence on a substrate, wherein the primer layer exhibits a sufficiently high level of resistance to solvent and wherein the image area portion of the primer layer exposed after the development is easily dyeable so as to afford an easy examination of the plate after the development.

To this end, according to the present invention, there is provided a water-less PS plate comprising a substrate, a primer layer formed on the substrate and containing hardened gelatin, a photosensitive layer formed on the primer layer, and a silicone rubber layer formed on the photosensitive layer.

In the water-less PS plate in accordance with the present invention, the hardened gelatin in the primer layer exhibits superior resistance to solvents which are used during formation of the photosensitive layer and the silicone rubber layer. In addition, problems caused by swelling of the primer layer due to contact with the developing solution, such as inferior image reproducibility and inferior fixation of image, can be avoided. Furthermore, the exposed gelatin-containing primer layer, which forms the image area, can be selectively dyed in a clear color.

BRIEF DESCRIPTION OF THE DRAWINGS

FIG. 1 shows that a primer layer 2, a photosensitive layer 3 and a silicone rubber layer 4 are formed in the mentioned order on a substrate 1, and FIG. 2 shows that the image area 4A is formed by a recess which penetrates both the silicone rubber layer 4 and the photosensitive layer 3 and through which the surface of the primer layer 2 is exposed.

DESCRIPTION OF THE PREFERRED EMBODIMENTS

Figure 1:
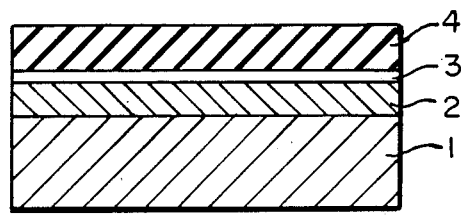
FIG. 1 is an enlarged sectional view of a photosensitive lithographic plate.
Figure 2:
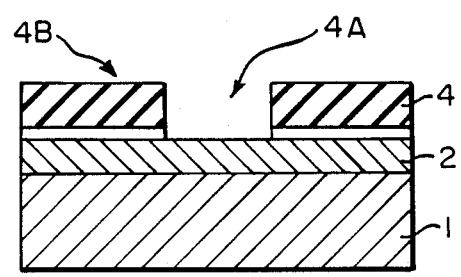
FIG. 2 is an enlarged sectional view of a water-less lithographic plate obtained by exposing and developing the photosensitive plate shown in FIG. 1.

A detailed description will be made hereinunder as to the water-less PS plate of the present invention and a method of producing the same.

Substrate

In general, the substrate is required to have a flexibility which is large enough to enable the plate to be mounted on an ordinary lithographic press, as well as strength high enough to withstand the load applied during printing. Typical examples of the substrate material are metallic sheets such as of aluminum, copper and steel, films or sheets of plastics such as polyethylene terephthalate, coated paper and rubber. It is also possible to use a composite substrate, a rubbery elastic substrate and a substrate which is beforehand shaped in the form of a cylinder.

Primer Layer

The primer layer used in the present invention is formed by making use of a hardened or crosslinked gelatin as the binder.

Gelatin generally known as photographic gelatin, which is most suitably obtained through an acid treatment or alkali treatment of bones and skins of cattle, may be used as the gelatin to be contained in the primer layer. This, however, is not exclusive and various natural gelatins in the form of natural polymeric compounds in the form of condensates of various amino acids containing a following general formula can be used.

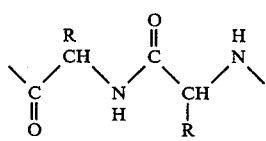

There are so many types of amino acids which constitute gelatin, and various compositions of gelatin are obtainable according to the processing conditions, as well as on the material used. The following hardening agents are usable for the purpose of hardening (i.e. crosslinking) the gelatin.

(A) Inorganic hardening agents
chrome alum and aluminum alum (B) Organic hardening agents
(B-1) aldehydes hardening agents
formaldehyde, glyoxal, succinaldehyde, glutaldehyde etc.

(B-2) N—methylols and acetals hardening agents

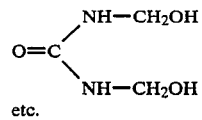

etc.

(B-3) epoxy hardening agents

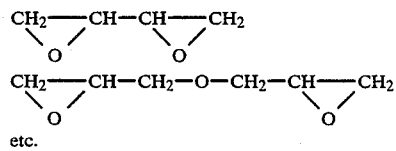

etc.

(B-4) aziridines hardening agents

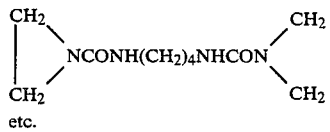

etc.

(B-5) mucohalogen acids hardening agents

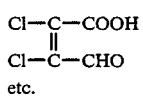

etc.

(B-6) active halogen type hardening agents

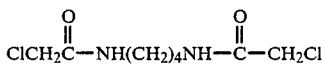

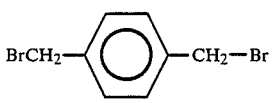

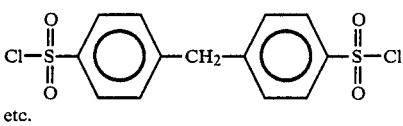

etc.

(B-7) dichloro-S—triazines hardening agents

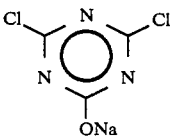

etc.

(B-8) active olefins hardening agents

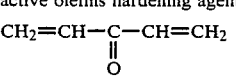

etc.

(B-9) carbodiimides hardening agents

-continued

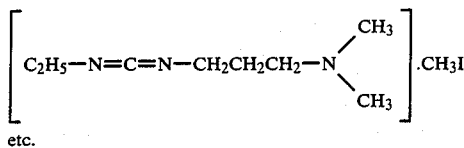
etc.

(B-10) isoxazolume salts hardening agents

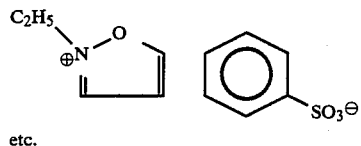
etc.

(B-11) methanesulfonic acid esters hardening agents

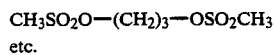
etc.

(B-12) active esters hardening agents

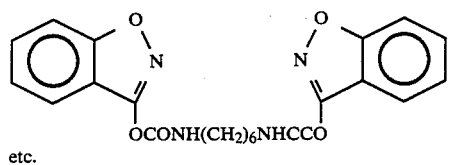
etc.

It will be obvious that different types of hardening agents are used depending on the type of the amino acid in the gelatin to be hardened. It will also be understood that the composition of the amino acid varies depending on the gelatin.

Thus, the optimum amount of the hardening agents used varies depending on the types of gelatin and the type of a hardening agent. In general, however, the optimum amount of the hardening agent generally ranges between 1 to 200 m mol, preferably 5 to 50 m mol, for 100 weight parts of gelatin.

A too small amount of the hardening agent will allow the swelling to become impractically large, with the result that the color after dyeing tends to be lost by, for example, a subsequent rinsing with water.

The value of mols of the amino acid available for the crosslinking in a given amount of gelatin is fixed. Thus, the addition of the hardening agent in a mol number in excess of the fixed mol number is meaningless. That is, there is a practical limit to the amount of addition of the hardening agent.

The gelatin-containing primer layer is preferably provided in a thickness of 0.1 to 50μ, particularly 0.5 to 10μ, after drying. The curing of the gelatin is preferably conducted by an ordinary measure such as heating, after applying an aqueous solution containing a gelatin and a hardening agent together on the substrate.

The primer layer can contain, as desired, a filler such as titanium oxide and a latex polymer, an anti-halation agent, a dyestuff for imparting printability, acid generating agent, and so forth.

Photosensitive Layer

The photosensitive layer in the water-less PS plate of the invention may be of any type, provided that it exhibits a change in the solubility in the developing solution when exposed.

Thus, the following compounds and compositions are usable as the material of the photosensitive layer.

(1) A photopolymerizable composition containing: an unsaturated monomer having a boiling temperature above 100° C. and non-volatile at room temperature or an oligomer thereof, a photosensitizer, a heat-polymerization inhibitor and, if necessary, a filler for maintaining the shape at room temperature and some additives.

Examples of the unsaturated monomers include: acrylate esters and methacrylate esters such as ethylene glycol di(metha)acrylate, polyethylene glycol di(metha)acrylate, hydroxyethyl, (metha)acrylate, hydroxypropyl(metha)acrylate, glycidyl (metha)acrylate, 1-chloro-2-hydroxyethyl (metha)acrylate; acrylamide derivatives such as ethylene bisacrylamide, N-methylol acrylamide, and methoxymethyl acrylamide; esters of allylalcohol such as triallylcyanurate, triallylphosphate, diallylphthalate, diallylmaleate; other stylene derivatives; and cinnamate derivatives.

Examples of the photosensitizer include benzophenon derivatives; benzoin derivatives; anthraquinone derivatives; aldehydes, ketone, sulfur compounds; halides; and dyestuffs such as methylene blue ribloflavin.

Examples of heat-polymerization inhibitor include hydroquinone derivatives; phenol derivatives; nitrosubstituted benzene; tertiary amines and phenothiazine derivatives.

Examples of materials usable as the filler or the additives include: fine powders of inorganic matters such as colloidal silica, calcium carbonate, magnesium carbonate, iron oxides; polyvinyl acetate; poly(metha)acrylate esters; polyethylenes having molecular weights of several of thousands; polypropylene; polyvinylchloride; vinyl polymers such as polyvinylidene chloride; and resin systems before curing such as resol phenol resins, uric resin, melamine resins, epoxy resins and unsaturated polyester resin.

(2) Compositions containing a polymer having the following groups in the main chain or side chain of the polymer.

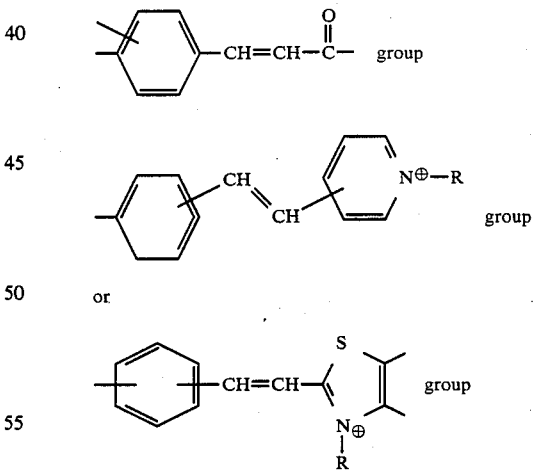

Compositions constituted mainly by photosensitive polymer such as polyesters, polyamides and polycarbonates having in the main or side chain the following substance:

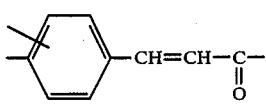

(Examples of such composition are described in U.S. Pat. Nos. 3,030,208, 3,707,373 and 3,453,237.)

Compositions composed mainly of photosensitive polyesters derived from a 2-propelidenemalonic acid compound such as cynnamylidène malonic acid and a difunctional glycol:

Examples of such compositions are described in U.S. Pat. Nos. 2,956,878 and 3,173,787.

Cinnamic acid esters of polymers containing hydroxyl groups such as polyvinyl alcohol, starch, cellulose and analogous of these polymers.

Examples are shown in the specifications of U.S. Pat. Nos. 2,690,966, 2,752,372 and 2,732,301.

Further, polymers such as those disclosed in J. P. KOKAI Nos. 58-25302 and 59-17550 can also be used in the present invention.

(3) A composition containing a photosensitive diazo resin or a photosensitive azido resin and, as desired, a photosensitizer and a small amount of filler additive.

Examples of the photosensitive diazo resins are zinc chloride double salts of condensates of formaldehyde and diazoamines such as p-diazodiphenylamine, p-diazomonoethylaniline, p-diazo-benzylethylaniline, and so forth.

Examples of the photosensitive azido resins are azidophthalic acid ester of polyvinylalcohol, azidobenzoic acid ester of polyvinyl alcohol, and ester of stylenemaleic anhydride copolymer and aromatic azido alcohol such as β-(4-azidophenol)ethanol.

Photosensitizers, fillers and additives mentioned in (1) above can be used also in this case.

(4) Composition containing O-quinone diazide compound.

O-quinone azido compounds most suitably used are O-naphthoquinone diazide compounds disclosed in many literature references such as the specifications of U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709 and 3,647,443.

Among these O-quinone diazide compounds, preferably used are: O-naphthoquinonediazide sulfonate ester or O-naphthoquinonediazide carboxylic acid ester of aromatic hydroxy compound; and O-naphthoquinonediazide sulfonate amide or O-naphthoquinonediazide-carboxylic acid amide of aromatic amide compound. Examples of these materials are: esters of benzoquinone-1,2-diazide-sulfonate or naphthoquinone-1,2-diazide-sulfonate and polyhydroxyphenyl (including partial ester: the same applies hereinafter); ester of naphthoquinone-1,2-diazide-4-sulfonate or naphthoquinone-1,2-diazide-5-sulfonate and pyrogallol acetone resin; ester of benzoquinone-1,2-diazidesulfonate or naphthoquinone-1,2-diazidesulfonate and novolak phenolformaldehyde resin or novolak cresolformaldehyde resin; amide of poly(p-aminostyrene) and naphthoquinone-1,2-diazide-4-sulfonate or naphthoquinone-1,2-diazide-5-sulfonate; ester of polyethyleneglycol and naphthoquinone-1,2-diazide-4-sulfonate or naphthoquinone-1,2-diazide-5-sulfonate; amide of polymeric amine and naphthoquine-1,2-diazide-4-sulfonate or naphthoquinone-1,2-diazide-5-sulfonate; ester of polymethacrylate p-hydroxyanilide and naphthoquinone-1,2-diazide-4-sulfonate or naphthoquinone-1,2-diazide-5-sulfonate; amide of amine-denatured natural resin rosin and naphthoquinone-1,2-diazide-5-sulfonate; ester of an epoxy resin from bisphenol A and propyleneoxide and naphthoquinone-1,2-diazide-5-sulfonate; ester of polymer of monoester of (metha)acrylate and dihydroxyphenyl and naphthoquinone-1,2-diazide-4-sulfonate or naphthoquinone-1,2-diazide-5-sulfonate; polymer of condensate of aminoisophthalate diallyl ester and naphthoquinonediazide-sulfonate; ester of polycarbonate and quinonediazide-sulfonate; quinonediazides crosslinked with isocyanate or the like; ester of bisphenol A and naphthoquinone-1,2-diazide-4-sulfonate or naphthoquinone-1,2-diazide-5-sulfonate; esters of naphthoquinone-1,2-diazide-5-sulfonate and phenols such as phenol, p-cresol or the like or alcohols such as ethylalcohol, propylalcohol, buthylalcohol and amylalcohol; and acid amides of naphthoquinone-1,2-diazide-5-sulfonate and amines such as aniline, p-hydroxyaniline and so forth.

Among these materials, the photopolymerizable composition described in (1) above and the photodimerizable material mentioned in (2) above are used most suitably as the material of the photosensitive layer.

As explained before, the thickness of the photosensitive layer is reduced as much as possible insofar as the photosensitive layer and the silicone rubber layer in the image area are removable in the developing process after an exposure. As a standard, however, it is advisable that the thickness of the photosensitive layer are generally below 1μ, particularly between 0.1 and 0.5μ.

In order to enhance the strength of the bonding between the primer layer and the photosensitive layer, it is possible to use a photosensitive layer material containing an organic tin compound and a silane coupling agent.

The organic tin compund can have the following construction, for example.

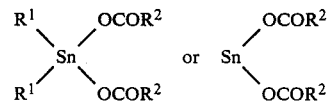

where $R^1$ represents an alkyl group having a carbon number ranging between 1 and 6, while $R^2$ represents an alkyl group having a carbon number ranging between 1 and 20. Typical examples of the organic tin compound are dibutyltin dioctanoate, dibutyltin dilaurate, dibutyltin diacetate, tin (II)octanoate, and so forth.

Amino silanes are preferably used as the silane coupling agent. The amino silanes mentioned in this specification generally includes substances represented by the following formula:

where, R represents an alkyl group having unsubstituted or substituted amino group, and R' and R" represent, respectively, an alkyl group or an aryl group. Symbols m represents 1 or 2 and n represents 0 or 1, wherein the condition of m+n=1 or 2 is met.

Typical examples of the amino silanes are 3-aminopropyl triethoxysilane, N-(2-aminoethyl)-3-aminopropyl trimethoxysilane, 3-aminopropyltrimethoxysilane, bis[3-(trimethoxysilyl)propyl]amine, bis[3-(trimethoxysilyl)propyl]ethylenediamine, N-(3-trimethoxysilylpropyl)morpholine, trimethoxysilyl propyldiethylenetriamine, bis(2-hydroxyethyl)aminopropylmethyldiethoxysilane, (N,N-diethyl-3-amino)propyltrimethoxysilane, N-methylaminopropyl trimethoxysilane, N- phenylaminopropyl trimethoxysilane, 1-trimethoxysilyl-2-(p-aminomethyl)-phenylethane, 1-trimethoxysilyl-2-(m-aminomethyl)phenylethane, and trimethoxysilyl propylallylamine.

Aromatic aminosilane compounds having the following structural formula are also usable.

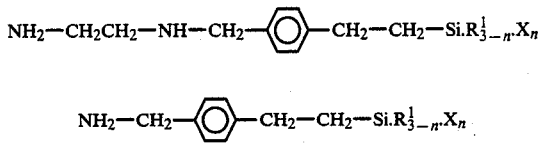

where
n=1 to 3,
$R^1$ is an alkyl group or a phenyl group having a carbon number of 1 to 3, and
X is a group which can be decomposed by dehydrolysis such a functional group expressed by: $—OR^2$, $—OCOR^2$,

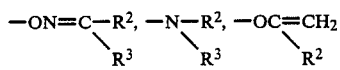

$R^2$ and $R^3$ represent an alkyl or a substituted alkyl having a carbon number of 1 to 3.

It is also possible to use a reactive silane compound having an allylisocyanulate group.

The composition of the reactive silane compound having an allylisocyanulate group usable in the invention is shown below by way of example.

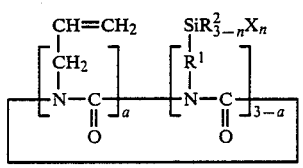

($R^1$: a bivalent coupling group containing at least one atom of carbon, oxygen, nitrogen and so forth, e.g., $—C_3H_6—$, $—C_3H_6—NH—C_3H_6$, and so forth.

$R^2$: alkyl or phenyl group having a carbon number of 1 to 3.

X: a group which can be decomposed by dehydrolysis, such as functional groups expressed by $—OR^3$, $—OCOR^3$,

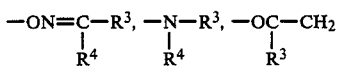

and so forth $R^3$m $R^4$: unsubstituted alkyl group or substituted alkyl group having carbon number of 1 to 3
a: 1 or 2, n: 1, 2 or 3

It is also possible to use a reactive compound having a ketoxime group.

Compositions expressed by the following formula are preferably used as the reactive silane compound having ketoxime group.

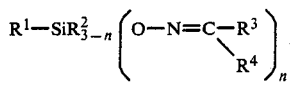

where, $R^1$ is an alkyl group having a carbon number of 1 to 3 (e.g., methyl group, ethyl group and propyl group), an alkenyl group having a carbon number of 2 to 5 (e.g., vinyl group and aryl group), an aminoalkyl group (e.g., N-(β-aminoethyl)—γ-aminopropyl group, γ-aminopropyl group), an aminoalkyl phenylalkylene group having an aromatic nuclide in the alkylene chain (e.g., N-(β-aminoethyl)aminomethylphenethyl group), γ-(metha)acryloxypropyl group, γ-glicydoxypropyl group or γ-mercaptopropyl group; $R^2$ represents an alkyl group or a phenyl group having a carbon number of 1 to 3; and $R^3$, $R^4$ represent an alkyl group having a carbon number of 1 to 3 or cycloalkane of 5 to 6 ring with $R^3$ and $R^4$ partially bonded to each other.

The sum of contents of the organic tin compound and the silane coupling agent is selected to range between 1 and 20 wt% of the photosensitive resin.

When the sum of contents is below 1%, no remarkable improvement is achieved in the bonding strength. On the other hand, if the sum of the contents is above 20%, the photosensitivity and the developability of the photosensitive resin are impaired seriously.

The ratio of content between the organic tin compound and the silane coupling (organic tin compound/silane coupling) is selected to range between 0.2 and 5.

When the ratio takes a value which is out of the range specified above, no remarkable improvement is attained in the bonding strength, as in the case where the organic tin compound or the silane coupling agent is added alone.

Silicone Rubber Layer

The silicone rubber layer used in the present invention is composed mainly of a linear organic polysiloxane having a carbon number on the order of several thousands or several tens of thousands and having a recurring unit shown below.

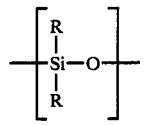

where, R is an alkyl group having a carbon number of 1 to 10 or a phenyl group. Preferably, not less than 60% of R is methyl groups. Such a linear organic polysiloxane is usually used in the form of a crosslinked silicone rubber with the addition of a reactive crosslinking agent. Examples of the crosslinkers for use with so-called room (low)-temperature curing type silicone rubber are: silanes with or without univalent organic group bonded to silicon atom, such as acetoxysilane, ketooximesilane, aminoxysilane, amidesilane, alkoxysilane and hydroxysilane; and low-polymerization condensates of these silanes such as siloxanes and organohydrogenpolysiloxanes.

In some cases, in order to improve the bonding strength between the photosensitive layer and the silicone rubber layer and to maintain the inter layer bonding strength for a long period of time, a reactive silane compound having an aryl isocyanulate group or a reactive silane compound having an aminoalkyl group is added to the silicone rubber compound.

The total amount of the reactive crosslinker and/or the reactive silane compound is selected to range between 0.05 and 10%, preferably between 0.1 and 5%. These bonding components may be used together in the form of a mixture.

The silicone rubber layer also may contain a catalyst such as a small amount of organic tin compound.

The silicone rubber layer preferably has a small thickness in order to attain a high tone reproducibility, but a certain minimum thickness is required from the viewpoint of durability in the printing and prevention of scumming. Usually, the silicone rubber layer has a thickness of 0.5 to 10μ, preferably between 1.0 and 3.0μ.

The water-less PS plate in accordance with the present invention basically has the above-described construction. The invention, however, does not exclude the formation of a bonding layer between the photosensitive layer and the silicone rubber layer. Such a bonding layer may be formed from various reactive crosslinkers and silane coupling agents. Amongst these materials of the bonding layer, used most effectively are silane coupling agents having oxime group, reactive silicone compounds having aminoaryl group, reactive silicone compound having aryl isocyanulate group, and organic titanate compound (primer of titanium group).

The thickness of the bonding layer theoretically may be not less than that of the monomolecular film. Due to reasons concerning the practical application operation, the bonding layer generally has a thickness of between 10 μm and 0.5μ. A too large thickness is not preferred from the viewpoint of economy and seriously deteriorates the image reproducibility because such a large thickness adversely affects the penetration of the developing solution into the photosensitive layer.

The water-less PS plate may have a protective film formed on the silicone rubber layer as desired.

Plate-making Process

The water-less PS plate according to the invention is first exposed through an image-bearing transparency and the resulting plate is developed by a developing solution which can dissolve the photosensitive layer in the image area, whereby the portions of the photosensitive layer and the silicone rubber layer thereon corresponding to the image area are removed, thus forming the water-less lithographic plate.

Various light sources can be used for the purpose of exposure such as a super-high voltage mercury lamp, carbon arc lamp, metal halide lamp, xenon lamp, chemical lamp, fluorescent lamp, and solar light.

The developing solution used in the development of image on the PS plate of the invention may be any developing solution conventionally used for the purpose of development on PS plates. Examples of such developing solutions are fatty hydrocarbons (e.g. hexane, heptane, "ISOPER E, H, G" (trademark name of a fatty hydrocarbon produced by Esso Kagaku)), gasoline, kerosene, aromatic hydrocarbon (toluene, xylene and so forth), or a halogenohydrocarbon (trichlene). In each case, one of the following polar solvents is used:

alcohols (methanol, ethanol, water, etc.)

ethers (methylcellosolve, ethylcellosolve, butysolve, methylcarbitol, ethylcarbitol, butylcarbitol, dioxane, etc.)

ketones (acetone, methylethylketone, etc.)

esters (ethylacetate, methylcellosolve acetate, cellosolve acetate, carbitol acetate, etc.)

The development is conducted by an ordinary method such as rubbing the plate with a developing pad containing the above-mentioned developing solution or by rubbing the plate with a developing brush after pouring the developing solution onto the plate. As a result, the silicone rubber layer and the photosensitive layer are removed in the region corresponding to the image area and the surface of the primer layer reveals so as to provide an ink receptive portion.

The water-less plate obtained by developing the water-less PS plate can be dyed by a dyeing solution after the development. The dyeing liquid is required to have such a nature as to be capable of selectively dyeing the primer layer containing cured gelatin which forms the image area, without substantially dyeing the silicone rubber layer which exists in the non-image area.

More specifically, the dye solution suitably used with the plate of the invention is formed by dissolving or dispersing, in a solvent having a strong polarity such as water or alcohol, a dyestuff such as a basic dyestuff, acidic dyestuff and dispersion dyestuff.

In order to improve the dyeability, it is possible and effective to add a suitable dyeing aid such as a carboxylic acid, amine, or a surfactant.

It is preferred that the development and dyeing be conducted in different steps as explained above, because such a process facilitates the design of the developing solution and dyeing solution, though the development and the dyeing may be conducted simultaneously by using a solution which is prepared by adding a dyestuff in a swellable organic solvent-based developing liquid.

From the foregoing description, it will be understood that the present invention provides a water-less PS plate having superior anti-solvent action and plate-examination properties. The advantages of the present invention will be fully realized from the following non-limitative examples. All parts and percentages are by weight unless otherwise indicated.

EXAMPLE 1

A primer layer material having the following composition was applied to a smooth aluminum plate which had been degreased by an ordinary method, in amount of 1.0 g/m² in terms in dry weight. The plate was then maintained at 100° C. for 2 seconds and then hardened by being dried.

| | |
|---|---|
| Photographic gelatin 680 (produced by Nitta Gelatin Kabushiki Kaisha) | 100 parts |
| Glyoxal solution (40 wt % aqueous solution, produced by Wako Junyaku K.K.) | 4.35 parts |
| Pure water | 4000 parts |

The primer layer after the curing was immersed in a developing solution and a mixture solvent for application of the photosensitive layer (mixture of methylcellosolveacetate/toluene=2/1 volume ratio) but the primer layer was not dissolved at all.

The following photosensitive composition was applied onto the primer layer on the aluminum plate in an amount of 0.25 g/m² and then dried.

| | |
|---|---|
| Photosensitive unsaturated polyester formed by 1:1 molar condensation of p-phenyldiacrylate and 1,4-dihydroxyethyloxycyclohexane | 10 parts |
| N—methyl-2-benzoylmethylene-β-naphthothiazoline | 0.6 part |
| N—(β-aminoethyl)aminomethylphenetyl | |

| | |
|---|---|
| trimethoxysilane | 0.4 part |
| Dibutyltin dioctanoate | 0.8 part |
| Sumitone cyanine blue VH 514 (phthalocyanin blue produced by Sumitomo Kagaku Kabushiki Kaisha) | 2 parts |
| Methylcellosolve acetate | 600 parts |
| Toluene | 300 parts |

Then, the following silicone rubber composition was applied to the photosensitive layer in an amount of 2.0 g/m² in terms of dry weight and then dried so that a cured silicone rubber layer was formed.

| | |
|---|---|
| Dimethylpolysiloxane with hydroxyl groups on both ends (molecular weight about 600,000) | 100 parts |
| Methylhydrogen polysiloxane with trimethylsilyl groups on both ends (molecular weight about 2500) | 3.5 parts |
| 1-methoxysilylpropyl-3,5-diarylisocyanulate | 3.5 parts |
| Dibutyltin dioctanoate | 3.3 parts |
| Isoper G (produced by Esso Kagaku Kabushiki Kaisha) | 2000 parts |

A polypropylene film with its one side having a mat surface and having a thickness of 12μ was superposed on the surface of the silicone rubber layer formed by the process explained above, thus forming a water-less PS plate with laminated structure.

A positive transparency was placed on the thus obtained PS plate and was held in close contact therewith by vacuum. The plate was exposed through this film for 30 counts by means of ET26V UDNS ULTRA-PLUS FLIP-TOP PLATE MAKER produced by Nuark Co., Ltd. The laminate film was then peeled off and the plate was immersed for 1 minute in a developing solution which was composed of 90 parts of Isoper H (produced by Esso Kagaku), 7 parts of diethylene glycol monobutylether, 3 parts of diethylene glycol monoethyl ether and 5 parts of diethyl succinate. The plate was then lightly rubbed with a developing pad, so that unexposed portion of the photosensitive layer and the corresponding silicone rubber layer thereon were removed. In consequence, a water-less plate was obtained in which the image on the positive film was reproduced with a high degree of fidelity over the entire area of the plate.

The tus obtained water-less plate was lightly wiped with the following dye solution, so that only the image where the primer layer was exposed was dyed in clean blue color.

| | |
|---|---|
| Methylene blue | 1 part |
| Pure water | 100 parts |

EXAMPLE 2

The following primer layer composition was applied to a smooth aluminum plate similar to that used in Example 1 in an amount of 1.0 g/m² in terms of dry weight, and the composition was heated for 2 minutes at 100° C. so as to be hardened.

Photographic gelatin (produced by Nitta gelatin)

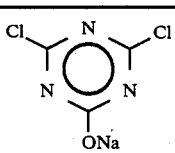

100 parts

| | |
|---|---|
| | 5.63 parts |
| Pure water | 4000 parts |

A photosensitive layer and a slicone rubber layer which were substantially the same as those used in Example 1 were formed on the cured primer layer, and a polypropylene film which also was similar to that used in Example 1 was placed on the silicone rubber layer, whereby a water-less PS plate was obtained.

The thus obtained original plate was exposed and developed in the same manner as Example 1 so that a water-less plate was formed carrying the image of the positive film reproduced with a high degree of fidelity.

This water-less plate was wiped with the same dye liquid as that used in Example 1, and the image area was dyed in a clean blue color.

For comparison, the following primer layer composition was applied onto a smooth aluminum plate similar to that used in Example 1, and was maintained at 120° C. for 5 minutes so as to be cured.

| | |
|---|---|
| Epikote 1001 (an epoxy resin of bisphenol A system produced by Shell Kagaku, with epoxy equivalent of 450 to 500) | 100 parts |
| Methyltetrahydrophthalic anhydride | 36 parts |
| 2,4,6-tris(dimethylaminomethyl)phenol | 10 parts |
| Methyl cellosolve acetate | 600 parts |
| Toluene | 600 parts |
| Methylethylketone | 600 parts |

Then, a water-less PS plate was formed by a process which was the same as those in Examples 1 and 2, except for the composition of the primer layer. The thus obtained water-less PS plate was exposed to an image and the formed latent image was developed, whereby a water-less plate reproducing the image of the positive film with a high degree of fidelity was obtained. This water-less plate was wiped with a dyeing solution substantially the same as that used in Examples 1 and 2, but the plate was not dyed substantially.

EXAMPLE 3

There was prepared a primer layer composition the same as in Example 1, except that 7.2 parts of

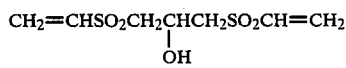

was used instead of 4.35 parts of glyoxal solution and then, the properties thereof were determined. As a result, the same effects as obtained in Example 1 were obtained.

What is claimed is:

1. A photosensitive lithographic plate requiring no dampening water, which comprises a metal substrate, and a primer layer containing a hardened gelatin, a photosensitive layer and a silicone rubber layer, in said order.

2. A photosensitive lithographic plate of claim 1, wherein the hardened gelatin is formed by adding a hardening agent to a photographic gelatin and curing it by heating.

3. A photosensitive lithographic plate of claim 2, wherein the hardening agent is an inorganic hardening agent or an organic hardening agent.

4. A photosensitive lithographic plate of claim 3, wherein the organic hardening agent is an aldehyde or a dichloro-s-triazine.

5. A photosensitive lithographic plate of claim 2, wherein the hardening agent is added to the gelatin in an amount of 1 to 200 m mol relative to 100 parts by weight of the gelatin.

6. A photosensitive lithographic plate of claim 1, wherein the primer layer is coated on the substrate in the dry thickness of 0.1 to 50μ.

7. A photosensitive lithographic plate of claim 1, wherein the primer layer further contains a filler, an anti-halation agent, a dyestuff or an acid generating agent.

8. A photosensitive lithographic plate of claim 1, wherein the photosensitive layer contains a photopolymerizable composition.

9. A photosensitive lithographic plate of claim 8, wherein the photopolymerizable composition comprises an unsaturated monomer having a boiling temperature above 100° C. and non-volatile at room temperature or an oligomer thereof, a photosensitizer and a heat-polymerization inhibitor.

10. A photosensitive lithographic plate of claim 1, wherein the photosensitive layer comprises a polymer having, in a main chain or side chain of the polymer the following group of

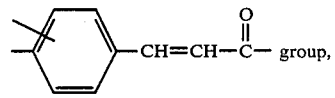

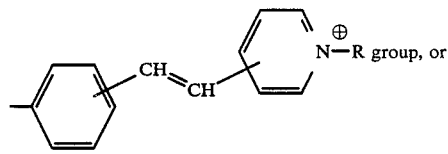

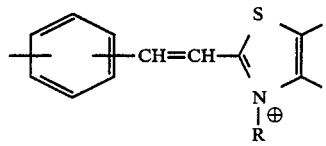

11. A photosensitive lithographic plate of claim 1, wherein the photosensitive layer comprises O-quinonediazide compound.

12. A photosensitive lithographic plate of claim 1, wherein the photosensitive layer further contains an organic tin compound and a silane coupling agent.

13. A photosensitive lithographic plate of claim 12, wherein the silane coupling agent is an amino silane.

14. A photosensitive lithographic plate of claim 1, wherein the photosensitive layer is coated on the primer layer in the thickness of not more than 1μ.

15. A photosensitive lithographic plate of claim 1, wherein silicone rubber layer is coated on the photosensitive layer in the thickness of 0.5 μm to 10μ.

* * * * *